United States Patent
Takano et al.

(10) Patent No.: US 8,871,684 B2
(45) Date of Patent: Oct. 28, 2014

(54) IRON-BASED SUPERCONDUCTING WIRE AND METHOD FOR PRODUCING THE SAME

(75) Inventors: Yoshihiko Takano, Ibaraki (JP); Yoshikazu Mizuguchi, Ibaraki (JP); Hiroaki Kumakura, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 385 days.

(21) Appl. No.: 13/376,248

(22) PCT Filed: Jun. 1, 2010

(86) PCT No.: PCT/JP2010/059278
§ 371 (c)(1),
(2), (4) Date: Feb. 1, 2012

(87) PCT Pub. No.: WO2010/140593
PCT Pub. Date: Dec. 9, 2010

(65) Prior Publication Data
US 2012/0135869 A1     May 31, 2012

(30) Foreign Application Priority Data

Jun. 5, 2009   (JP) ................. 2009-136662

(51) Int. Cl.
- *H01L 39/24* (2006.01)
- *H01B 13/00* (2006.01)
- *C01B 19/00* (2006.01)
- *H01L 39/12* (2006.01)
- *H01L 39/14* (2006.01)

(52) U.S. Cl.
CPC ............ *C01B 19/007* (2013.01); *H01L 39/125* (2013.01); *H01L 39/14* (2013.01); *H01L 39/24* (2013.01); *C01P 2002/85* (2013.01); *C01P 2004/03* (2013.01); *Y10S 505/704* (2013.01)

USPC ........ 505/430; 505/431; 505/704; 174/125.1; 29/599

(58) Field of Classification Search
CPC ....... H01L 39/00; H01L 39/12; H01L 39/125; H01L 39/14; H01L 39/24; H01L 39/2477; H01L 39/248; H01B 12/00; H01B 12/04; H01B 12/06; H01B 12/10; Y10S 505/70; Y10S 505/704; Y10S 505/74; Y10S 505/813; Y10S 505/919; C04B 35/45; C04B 35/515; C04B 35/547
USPC ......... 505/100, 124, 150, 230, 231, 232, 430, 505/431, 500, 704, 740, 813, 821; 174/125.1; 29/599; 148/96
See application file for complete search history.

(56) References Cited

U.S. PATENT DOCUMENTS

2003/0036482 A1 *  2/2003  Thieme et al. ................ 505/100

OTHER PUBLICATIONS

Mizuguchi et al., "Fabrication of the Iron-Based Superconducting Wire Using Fe(Se,Te)," Applied Physics Express 2 (2009) 083004. Published online Aug. 7, 2009.*
Mizuguchi et al., "Superconductivity at 27 K in tetragonal FeSe under high pressure," Applied Physics Letters 93, 152505 2008.*

* cited by examiner

*Primary Examiner* — Stanley Silverman
*Assistant Examiner* — Kallambella Vijayakumar
(74) *Attorney, Agent, or Firm* — Wenderoth, Lind & Ponack, L.L.P.

(57) ABSTRACT

Disclosed is an iron-based superconducting wire comprising a tubular material formed mainly from iron, and an iron-based superconductor formed in the tubular material, wherein the iron-based superconductor contains the iron forming the tubular material as a chemical constituent element of the iron-based superconductor.

1 Claim, 5 Drawing Sheets

US 8,871,684 B2

IRON-BASED SUPERCONDUCTING WIRE AND METHOD FOR PRODUCING THE SAME

This application is a U.S. national stage of International Application No. PCT/JP2010/059278 filed Jun. 1, 2010.

TECHNICAL FIELD

The present invention relates to an iron-based superconducting wire using an iron-based superconductor mainly made of iron and a method for producing the same.

BACKGROUND ART

An iron-based superconductor was discovered early in 2008 (non-patent document 1). Since this discovery of the iron-based superconductor, superconductors of the related compounds have been successively found, and the iron-based superconductor is expected to be a vein of new high-temperature superconductor.

The iron-based superconductors have a high critical current density and a high critical magnetic field, and are increasingly expected to be applied to practical use. Among the iron-based superconductors, ones having a simplest structure, such as FeSe, FeTe, $FeSe_{1-x}Te_x$ ($0<x<1$), and $FeTe_{1-x}S_x$ ($0<x<1$), have been developed by the present inventors (for example, non-patent documents 2 and 3). Further, it has been known that, in the molar ratio of Fe and a chalcogen in the compound, Fe is slightly excess. These iron-based superconductors are considered suitable for practical application due to their relatively low toxicity or simple structure.

[Non-patent document 1] J. Am. Chem. Soc., 130, 3296 (2008)

[Non-patent document 2] Appl. Phys. Lett, 94, 012503 (2009)

[Non-patent document 3] Appl. Phys. Lett, 93, 152505 (2008)

DISCLOSURE OF THE INVENTION

Problems that the Invention is to Solve

A task of the present invention is to apply an iron-based superconductor to practical use, and to provide an iron-based superconducting wire using an iron-based superconducting substance, such as FeSe, FeTe, $FeSe_{1-x}Te_x$ ($0<x<1$), or $FeTe_{1-x}S_x$ ($0<x<1$), and a method for producing the same.

Means for Solving the Problems

For solving the above problems, the iron-based superconducting wire of the invention is characterized in that the iron-based superconducting wire comprises a tubular material formed mainly from iron, and an iron-based superconductor formed in the tubular material, wherein the iron-based superconductor contains the iron forming the tubular material as a chemical constituent element of the iron-based superconductor.

In the iron-based superconducting wire, it is preferred that the tubular material is a sheath for superconducting wire.

Further, in the iron-based superconducting wire, it is preferred that the iron-based superconductor has a chemical composition which is FeSe, FeTe, $FeSe_{1-x}Te_x$ ($0<x<1$), or $FeTe_{1-x}S_x$ ($0<x<1$).

Further, in the iron-based superconducting wire, a plurality of the iron-based superconducting wires can be unified to form a multicore wire.

The method for producing an iron-based superconducting wire of the invention is characterized in that the method comprises filling a tubular material formed mainly from iron with a raw material which comprises a chemical constituent element other than iron for constituting an iron-based superconductor, and then subjecting the resultant material to mechanical processing to form a wire material, and subjecting the wire material to heating treatment at 100 to 1,000° C. for one minute to 500 hours so that the iron forming the tubular material and the raw material filling the tubular material are reacted with each other to form an iron-based superconductor, obtaining an iron-based superconducting wire.

Advantage of the Invention

The iron-based superconducting wire of the invention and a method for producing the same are advantageous in that, by filling a tubular material formed mainly from iron with a raw material other than iron for constituting an iron-based superconductor, an iron-based superconducting wire can be produced with ease, and the iron-based superconducting wire exhibits stable superconductivity.

MODE FOR CARRYING OUT THE INVENTION

Figure 1:
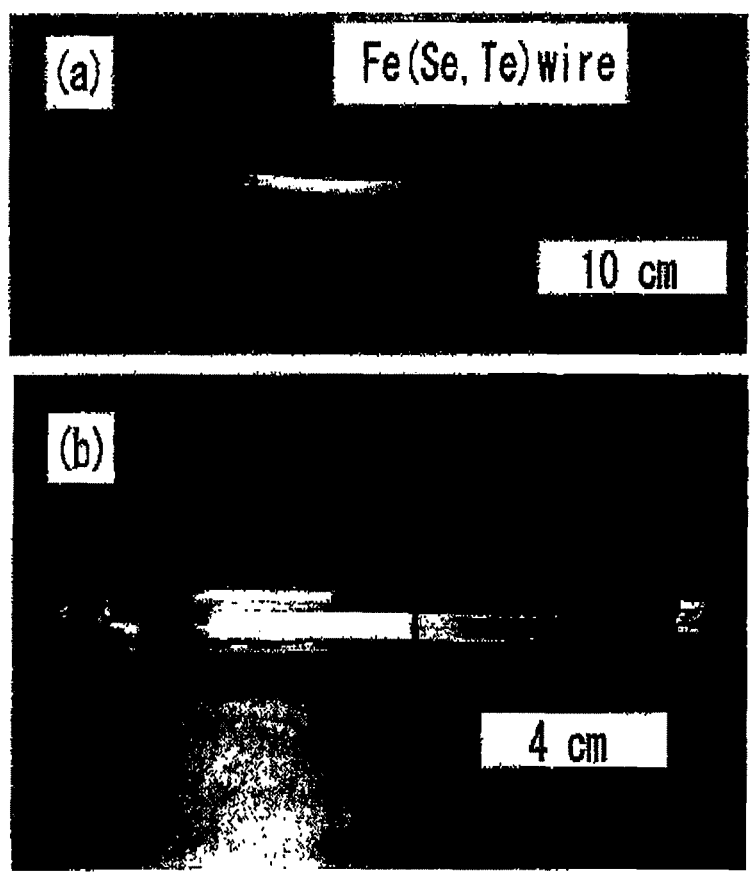
FIG. 1 shows photographs of (a) the wire after rolled and (b) the wire after subjected to heat treatment in the Example.

In the iron-based superconducting wire of the invention, using a tubular material formed mainly from iron, an iron-based superconductor is formed from the iron forming the tubular material, and a raw material which fills the tubular material and which comprises a chemical constituent element constituting the iron-based superconductor other than iron. That is, in a tubular material formed mainly from iron, an iron-based superconductor containing the iron forming the tubular material as a chemical constituent element of the iron-based superconductor is formed.

The tubular material is formed mainly from iron for making a contribution to the formation of an iron-based superconductor, and the tubular material can contain an additive or inevitably contained impurity other than iron in such an amount that it does not inhibit the formation of an iron-based superconductor. For example, the addition of a hexagonal phase, a pyrite phase, silver, iron oxide, bismuth, or the like is allowable.

In the iron-based superconducting wire of the invention, as typical examples of chemical compositions of the iron-based superconductor, there can be mentioned FeSe, FeTe, $FeSe_{1-x}Te_x$ ($0<x<1$), and $FeTe_{1-x}S_x$ ($0<x<1$), which have already been developed, but with respect to the chemical composition of the iron-based superconductor, there is no particular limitation as long as a wire can be formed from the iron-based superconductor.

On the other hand, the composition ratio of the chemical constituent elements constituting the iron-based superconductor can be appropriately changed. For example, in FeSe$_{1-x}$Te$_x$ (0<x<1) or FeTe$_{1-x}$S$_x$ (0<x<1), the Se:Te ratio or Te:S ratio can be appropriately changed within the range: 0<x<1.

The tubular material formed mainly from iron can function and serve as a sheath for superconducting wire.

With respect to the element raw material other than iron, which fills the tubular material, a single substance of Se, Te, or S or a mixture thereof, or a compound preliminarily synthesized, such as SeTe or TeS, can be used.

A method for producing the iron-based superconducting wire of the invention is, for example, shown below.

1) A tubular material formed mainly from iron is filled with a raw material which comprises a chemical constituent element other than iron for constituting an iron-based superconductor.

2) The resultant material is subjected to mechanical processing, such as rolling, to form a wire material.

3) The wire material is subjected to heat treatment at 100 to 1,000° C. for one minute to 500 hours to form an iron-based superconductor.

The use of preliminarily synthesized SeTe or TeS as a raw material filling the tubular material is effective in preventing Se or S from evaporating during the heat treatment.

Further, when conducting the heating treatment in an inert gas atmosphere in a closed state, Se or S can be effectively prevented from diffusing.

Further, for introducing a pinning center, into a raw material other than iron for filling the tubular material, such as SeTe, an additive, for example, a hexagonal phase, a pyrite phase, silver, iron oxide, or bismuth can be incorporated in such an amount that the superconductivity is not sacrificed.

The invention has been completed by succeeding in observing a critical current of the iron-based superconducting wire in an electrical conduction test for the first time, and possibly gives an effective technical guideline on the future wire formation from the iron-based superconductor. For example, a multicore iron-based superconducting wire comprising a plurality of the iron-based superconducting wires which are unified to form a multicore wire can be realized.

EXAMPLES

A test preparation of a wire was conducted using a Powder-in-Tube method. An iron tube having an outer diameter of 6 mm and an inner diameter of 3.5 mm was used as a sheath, and filled with Se or preliminarily synthesized SeTe, and the both ends of the iron tube were sealed up. Then, the sealed tube was rolled using a groove roll until the outer diameter became 2 mm, and further rolled using a flat roll until the width became 4 to 5 mm and the thickness became about 0.55 mm. The resultant wire was cut into about 4 cm, and the cut short-length wire was sealed in a quartz tube in an argon gas atmosphere (equivalent to atmospheric pressure). Then, the wire was subjected to heating treatment under the conditions shown in Table 1. The heating temperature is 450 to 550° C., and the heating time is 3 to 4 hours including the temperature increase time. After the heating treatment, a voltage-current measurement was performed by an electrical conduction test to estimate a critical current (Ic).

FIG. 1(a) is a photograph of the wire obtained by rolling an iron tube (sheath) filled with SeTe powder, which has not been calcined, and FIG. 1(b) is a photograph of the wire which has been calcined by a heating treatment in an argon gas atmosphere.

SeTe used as a raw material other than iron is obtained by vacuum-sealing Se and Te weighed in a 1:1 molar ratio in a quartz tube and then calcining them at 500° C. for 8 hours to synthesize SeTe, and subsequently grinding the synthesized SeTe.

The Se and Te used are as follows.

The Se used is Se powder having a purity of 99.9% up and an average particle size of 75 µm, manufactured by Kojundo Chemical Laboratory Co., Ltd.

The Te used is Te powder having a purity of 99.9% and an average particle size of 150 µm, manufactured by Kojundo Chemical Laboratory Co., Ltd.

TABLE 1

| Experiment No. | Starting material powder | Heat treatment temperature | Temperature increase time | Retention time |
| --- | --- | --- | --- | --- |
| 1 | SeTe | 500° C. | 2 h | 2 h |
| 2 | SeTe | 500° C. | 2 h | 1 h |

Figure 2:
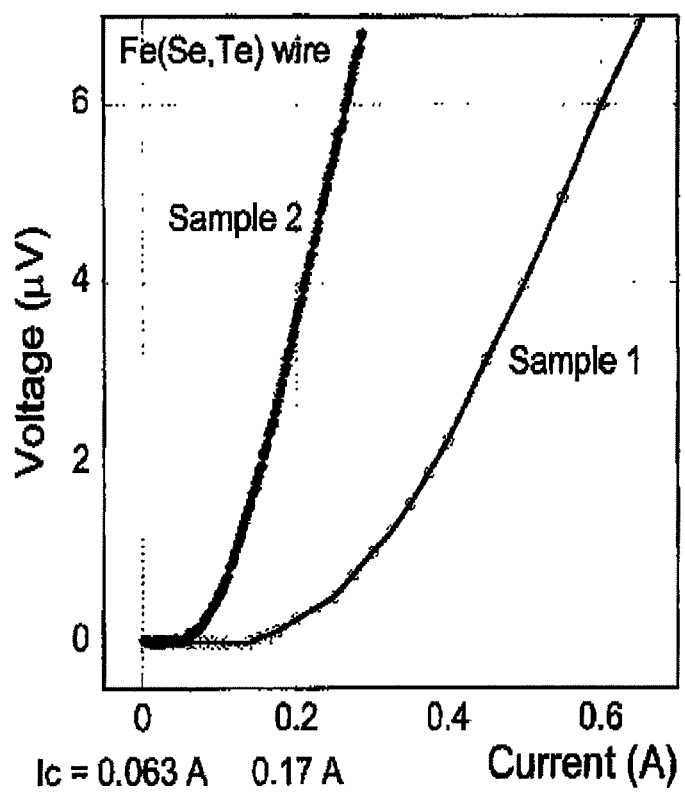
FIG. 2 is a graph showing the current-voltage characteristics of the $FeSe_{1-x}Te_x$ ($0<x<1$) superconducting wire prepared in the Example.

As can be seen from Samples 1 and 2 shown FIG. 2, with respect to the FeSe$_{1-x}$Te$_x$ (0<x<1) wires prepared by calcination under the conditions for Experiment Nos. 1 and 2 shown in Table 1 (wherein Sample 1 corresponds to Experiment No. 1 and Sample 2 corresponds to Experiment No. 2), the zero resistance state has been confirmed until a certain current, and a critical current at a threshold of 0.1 µV has been successfully estimated. An iron-based superconductor wire has been realized.

The cross-section of the wire was polished, and the polished cross-section was observed by means of an optical microscope and an SEM (scanning electron microscope), and further, using EDX (energy dispersive X-ray spectroscopy), surface mapping for elements was conducted.

Figure 3:
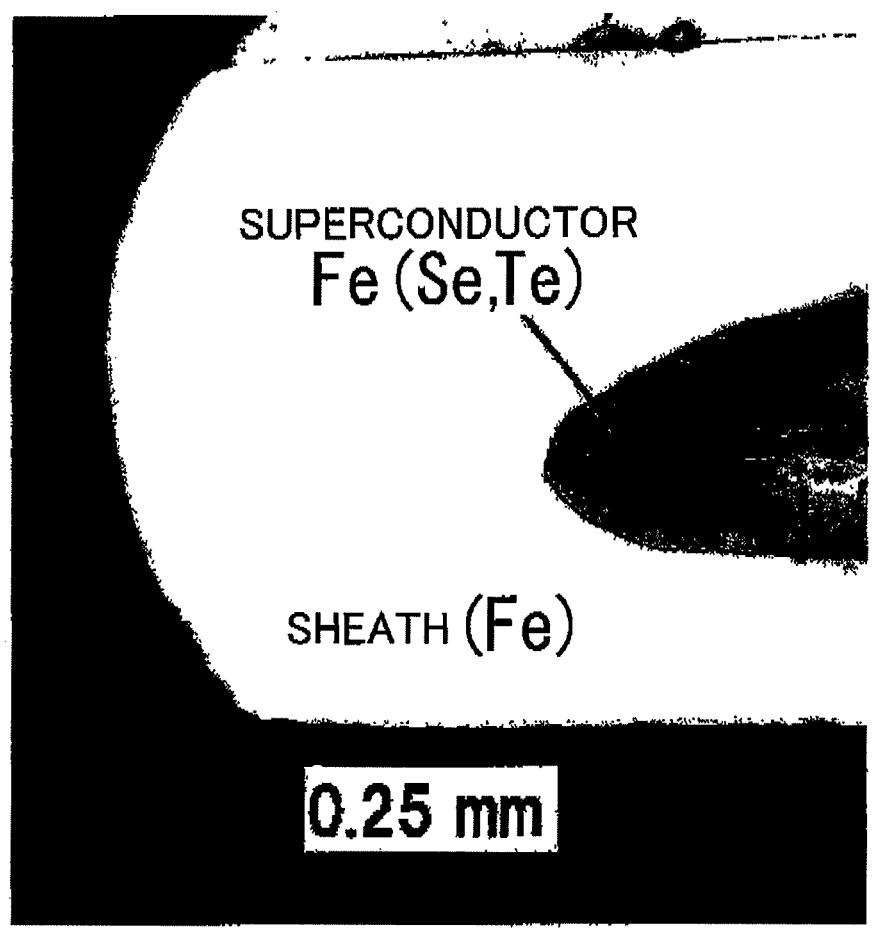
FIG. 3 is a photograph taken by an optical microscope of the cross-section of the $FeSe_{1-x}Te_x$ ($0<x<1$) superconducting wire prepared in the Example.
Figure 4:
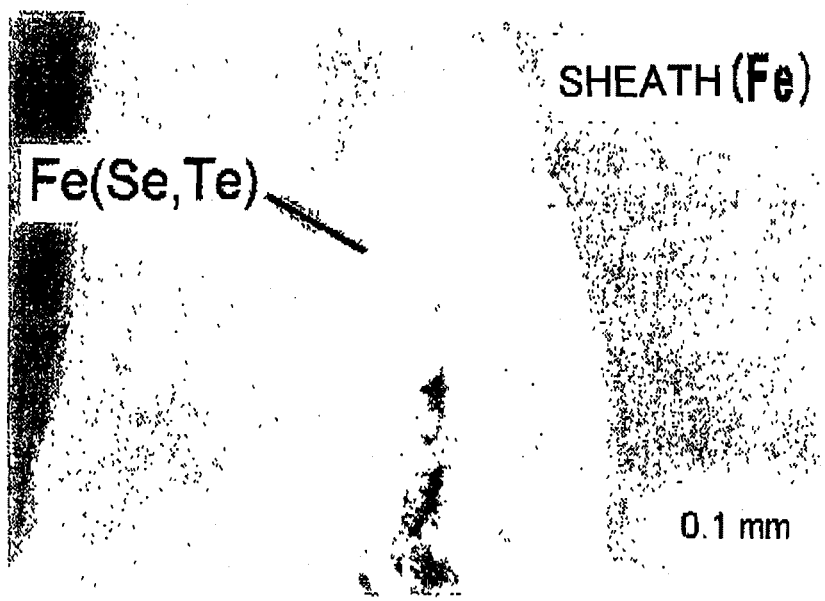
FIG. 4 is a scanning electron microscope image of the $FeSe_{1-x}Te_x$ ($0<x<1$) superconducting wire prepared in the Example.
Figure 5:
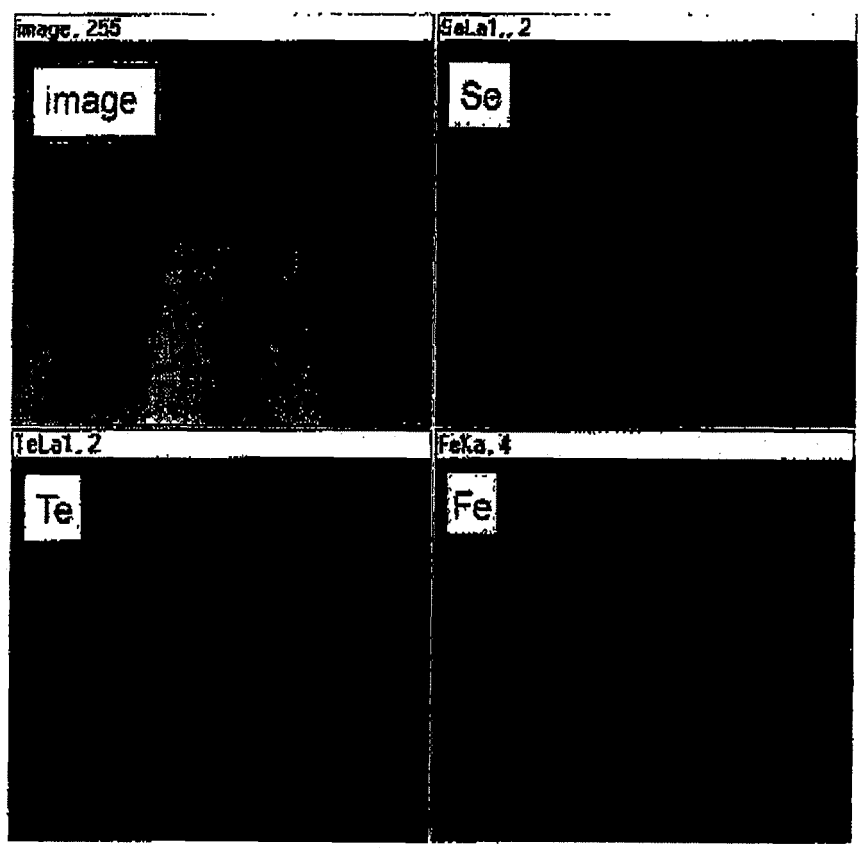
FIG. 5 shows photographs showing the results of surface mapping measured with respect to the cross-section of the $FeSe_{1-x}Te_x$ ($0<x<1$) superconducting wire prepared in the Example.

FIG. 3 is a photograph taken by an optical microscope of the cross-section of the wire obtained by embedding in a resin the wire prepared under the conditions for Experiment No. 1 shown in Table 1 and polishing it. FIG. 4 is a scanning electron microscope image of the cross-section of the wire prepared under the conditions for Experiment No. 1 shown in Table 1. FIG. 5 is surface mapping as measured by EDX (energy dispersive X-ray spectroscopy) with respect to the cross-section of the wire prepared under the conditions for Experiment No. 1 shown in Table 1. The analysis was performed using an Fe-Kα ray, an Se-Lα ray, and a Te-Lα ray. The results of the analysis have confirmed that an iron-based superconductor having a chemical composition which is FeSe$_{1-x}$Te$_x$ (0<x<1) is formed in the iron sheath.

Iron-based superconducting wires respectively having FeSe and FeTe$_{1-x}$S$_x$ (0<x<1) chemical compositions were able to be prepared under the same conditions as those for Experiment Nos. 1 and 2 shown in Table 1. In the preparation of the FeTe$_{1-x}$S$_x$ (0<x<1) superconducting wire, Te$_{1-x}$S$_x$, which had been preliminarily synthesized by reacting Te with S and changing the composition ratio of Te and S, was used as a raw material other than iron. From the studies on polycrystals of FeSe, FeSe$_{1-x}$Te$_x$ (0<x<1), and FeTe$_{1-x}$S$_x$ (0<x<1), it has been known that a synthesis in the solid solution system is possible. For example, Te and S were mixed in a 1:1 molar ratio and vacuum-sealed in a quartz glass tube, and then calcined at 400° C. for ½ day, so that all the Te and S were reacted with each other, thus obtaining TeS.

For changing the composition ratio, an iron tube (sheath) was filled with the above-obtained TeS, together with Te, and formed into a wire, followed by a heating treatment at 450 to 600° C., to obtain an iron-based superconducting wire in which the chemical composition of the iron-based superconductor is $FeTe_{1-x}S_x$ ($0<x<1$). In each of the iron-based superconducting wires, a critical current was observed.

The iron-based superconducting wire of the invention and a method for producing the same are not limited to the above-mentioned Examples needless to say.

INDUSTRIAL APPLICABILITY

The iron-based superconducting wire of the invention and a method for producing the same are advantageous in that an iron-based superconducting wire using an iron-based superconducting substance, such as FeSe, FeTe, $FeSe_{1-x}Te_x$ ($0<x<1$), or $FeTe_{1-x}S_x$ ($0<x<1$), can be produced with ease. It is expected that the iron-based superconductor is put into practical use and the use thereof is advanced and developed.

The invention claimed is:

1. A method for producing an iron-based superconducting wire, the method comprises filling a tubular sheath material formed mainly from iron with a raw material which comprises a chemical constituent element other than iron for constituting an iron-based superconductor, and then subjecting the resultant material to mechanical processing to form a wire material, and subjecting the wire material to heating treatment at 100 to 1,000° C. for one minute to 500 hours so that the iron forming the tubular sheath material and the raw material filling the tubular sheath material are reacted with each other to form an iron-based superconductor, and obtaining the iron-based superconducting wire.

* * * * *